United States Patent
Van Haren et al.

(10) Patent No.: US 8,319,967 B2
(45) Date of Patent: Nov. 27, 2012

(54) MARKER STRUCTURE AND METHOD OF FORMING THE SAME

(75) Inventors: Richard Johannes Franciscus Van Haren, Waalre (NL); Sanjaysingh Lalbahadoersing, Helmond (NL); Sami Musa, Veldhoven (NL); Patrick Warnaar, Tilburg (NL); Maya Angelova Doytcheva, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 798 days.

(21) Appl. No.: 12/328,167

(22) Filed: Dec. 4, 2008

(65) Prior Publication Data
US 2009/0147232 A1 Jun. 11, 2009

Related U.S. Application Data

(60) Provisional application No. 60/996,784, filed on Dec. 5, 2007.

(51) Int. Cl.
G01B 11/00 (2006.01)
G03B 27/54 (2006.01)
G03B 27/42 (2006.01)

(52) U.S. Cl. ............. 356/401; 356/399; 355/53; 355/67

(58) Field of Classification Search ................. None
See application file for complete search history.

(56) References Cited

U.S. PATENT DOCUMENTS

| 6,060,786 A | * | 5/2000 | Wang | 257/797 |
| 6,884,733 B1 | * | 4/2005 | Dakshina-Murthy et al. | 438/717 |
| 2007/0190805 A1 | * | 8/2007 | Lin | 438/778 |
| 2007/0216832 A1 | * | 9/2007 | Takahashi et al. | 349/106 |

FOREIGN PATENT DOCUMENTS

EP 1477860 A1 * 11/2004
JP 2007-214560 8/2007

OTHER PUBLICATIONS

Japanese Office Action dated Jan. 26, 2012 in corresponding Japanese Patent Application No. 2010-536868.

* cited by examiner

*Primary Examiner* — Toan Ton
*Assistant Examiner* — Michelle Iacoletti
(74) *Attorney, Agent, or Firm* — Pillsbury Winthrop Shaw Pittman LLP

(57) ABSTRACT

The invention relates to a marker structure for optical alignment of a substrate and provided thereon. The marker structure has a first reflecting surface at a first level and a second reflecting surface at a second level. A separation between the first level and the second level determines a phase depth condition. The marker structure further has an additional structure. The additional structure is arranged to modify the separation during manufacture of the marker structure. The invention further relates to a method of forming such a marker structure.

12 Claims, 8 Drawing Sheets

MARKER STRUCTURE AND METHOD OF FORMING THE SAME

CROSS-REFERENCE TO RELATED APPLICATIONS

This application claims priority and benefit under 35 U.S.C. §119(e) to U.S. Provisional Patent Application No. 60/996,784, entitled "Marker Structure and Method of Forming the Same" filed on Dec. 5, 2007. The content of that application is incorporated herein in its entirety by reference.

FIELD

The present invention relates to a marker structure for optical alignment of a substrate and provided thereon, a method of forming such a marker structure, a lithographic projection apparatus configured to expose a patterned beam on a substrate provided with such a marker structure, and a method of alignment of a substrate provided with such a marker structure in a lithographic projection apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In device manufacturing methods using lithographic apparatus, an important factor in the yield, i.e., the percentage of correctly manufactured devices, is the accuracy within which layers are printed in relation to layers that have previously been formed. This is known as overlay and the overlay error budget will often be 10 nm or less. To achieve such accuracy, the substrate should be aligned to the mask pattern to be transferred with great accuracy.

Currently, alignment marks and/or overlay targets are defined in back end of line metal layers without considering a phase depth of the respective mark. Layer thicknesses used by chip manufacturers are fixed by design and extremely hard to change in favor of an improved alignment mark performance. In some cases, typical phase depth values are such that low signal strengths are measured, which renders performing a sufficiently accurate alignment measurement more difficult. In such cases, switching the wavelength with which the alignment is performed may improve the performance. However, such wavelength switching is not always possible, and may not be sufficient. Additionally, marks may operate in a regime where aligned position is very sensitive to phase depth fluctuations. This may also hamper accurate alignment.

SUMMARY

It is desirable to be able to provide a marker structure with a phase depth condition that can be modified. For this purpose, an embodiment of the invention provides a marker structure for optical alignment of a substrate and provided thereon, the marker structure comprising:
 a first reflecting surface at a first level;
 a second reflecting surface at a second level, a separation between the first level and the second level determining a phase depth condition;
wherein the marker structure further comprises an additional structure, the additional structure being arranged to modify the separation during manufacture of the marker structure.

In an embodiment, the invention further provides a method of forming such a marker structure on a substrate, the method comprising:
 providing a substrate;
 providing a first layer on the substrate and creating a first pattern therein, the first pattern including a periodic structure of a series of lines with interposed trenches;
 providing a second layer on top of the first pattern in the first layer, and polishing the second layer until the series of lines in the first layer appears;
 providing a third layer on top of the second layer, the third layer being reflective for radiation of a certain wavelength;
wherein a thickness of the second layer is chosen such that a certain separation between a surface of the third layer on top of the series of lines and a surface of the third layer at the bottom of the interposed trenches is established.

In an embodiment, the invention further provides a method of forming such a marker structure on a substrate, the method comprising:
 providing a substrate with a surface side reflective for radiation with a certain wavelength, so as to serve as a first reflecting surface of the marker structure;
 providing a first layer on the reflective surface side of the substrate, the first layer being an electrically insulating layer, and creating an additional structure therein;
 providing a second layer on top of the first layer provided with the additional structure therein, the second layer comprising a filler material;
 polishing the second layer until the additional structure appears, so as to form a substantially plain surface;
 providing a third layer on top of the substantially plain surface, and providing a first pattern therein, the first pattern comprising a periodic structure comprising elements reflective for radiation with the certain wavelength so as to serve as a second reflecting surface of the marker structure.

In an embodiment, the invention further provides a lithographic projection apparatus comprising:
 an illumination system configured to provide a beam of radiation;
 a support structure configured to support a patterning device that serves to impart the beam of radiation with a pattern in its cross-section;
 a substrate table configured to hold a substrate;
 a projection system configured to expose the patterned beam on the substrate;
 a substrate alignment system configured to detect a position of the substrate relative to a position of the patterning device, said substrate comprising at least one marker structure as mentioned above.

Finally, in an embodiment, the invention provides a method of alignment of a substrate in a lithographic projection apparatus comprising:
- a support structure configured to support a patterning device that serves to impart a beam of radiation with a pattern in its cross-section;
- a substrate table configured to hold a substrate;
- a projection system configured to expose the patterned beam on the substrate;
- a substrate alignment system comprising at least one light source, a sensor device, and a processor, the substrate alignment system being configured to detect a position of the substrate relative to a position of the patterning device;

the method, performed by the substrate alignment system, comprising:
- providing at least one alignment beam of radiation aimed at a marker structure as described above;
- detecting an optical signal reflected from the marker structure;
- determining alignment information from the optical signal, the alignment information comprising information relating a position of the substrate to the sensor device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
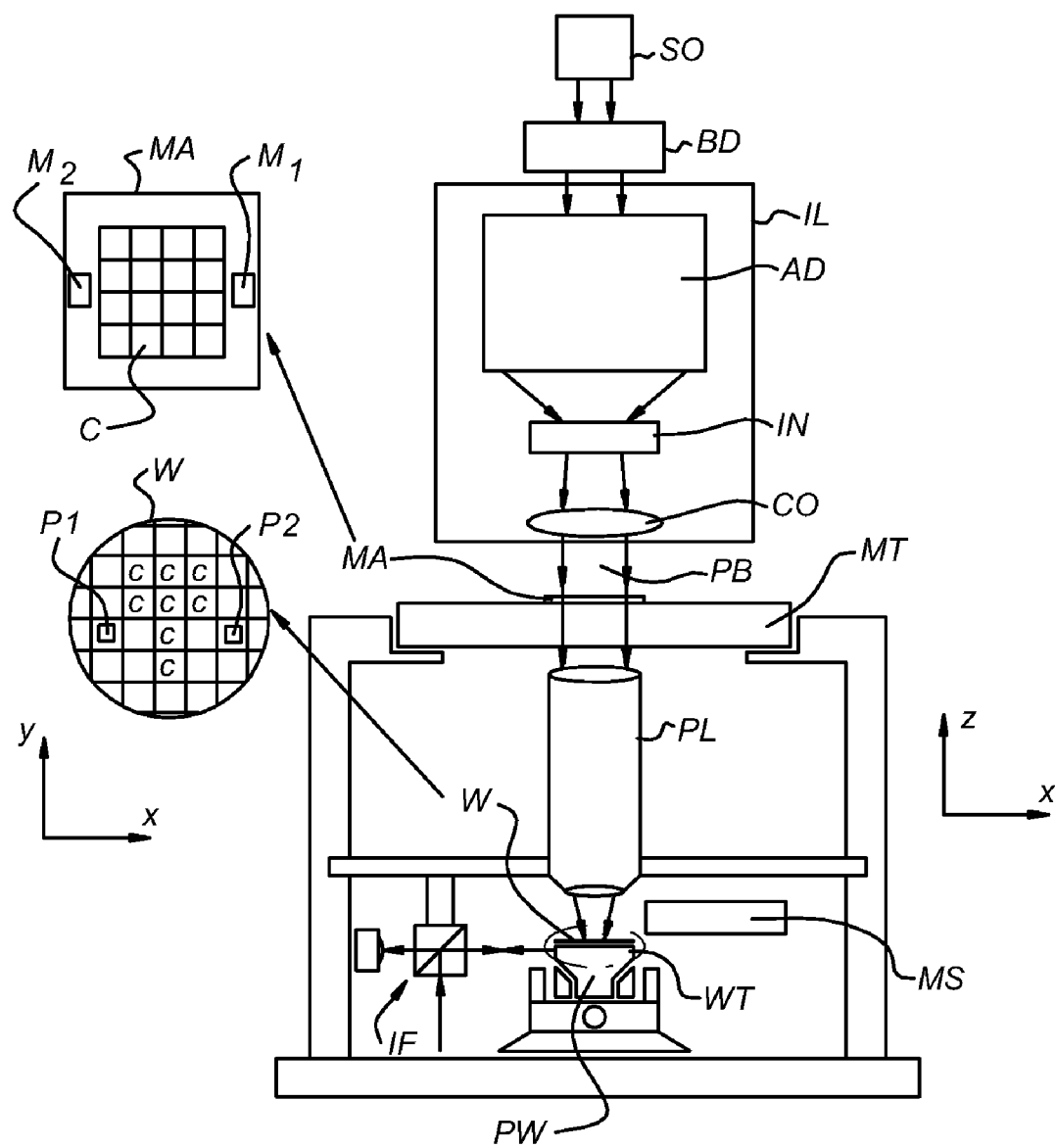
FIG. 1 schematically depicts a lithographic apparatus in accordance with an embodiment of the invention.

FIG. 1 schematically depicts a lithographic apparatus according to one embodiment of the invention. The apparatus comprises:

- an illumination system (illuminator) IL configured to condition a radiation beam B (e.g., UV radiation or EUV-radiation).
- a support structure (e.g., a mask table) MT constructed to support a patterning device (e.g., a mask) MA and connected to a first positioner PM configured to accurately position the patterning device in accordance with certain parameters;
- a substrate holder, e.g., a substrate table (e.g., a wafer table) WT, constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The position sensor IF typically comprises a light source, such as a laser (not shown), and one or more interferometers for determining some information (e.g., position, alignment, etc.) regarding an object to be measured, such as a substrate W or a substrate stage WT. The light source (laser) may produce a metrology beam MB which is routed to the interferometer by one or more beam manipulators. In case more than one interferometer is present, the metrology beam may be shared between them, e.g., by using optics that split the metrology beam in various separate beams for each interferometer.

In FIG. 1, furthermore, a substrate alignment system MS is schematically shown for alignment of a substrate W on table WT with a patterning device, e.g., the mask MA on mask table MT. The substrate alignment system MS is shown at an exemplary location close to substrate table WT. It comprises at least one light source which generates a light beam aimed at one or more marker structures on the substrate W, e.g., substrate alignment marks P1, and at least one sensor device which detects an optical signal reflected from that marker structure. The substrate alignment system MS further comprises a processor configured to determine alignment information from the optical signal reflected from the marker structure and detected by the at least one sensor device. The alignment information comprises information relating a position of the substrate to the sensor device. It is noted that the location of the substrate alignment system MS depends on design conditions which may vary with the actual type of lithographic projection apparatus.

Figure 2:
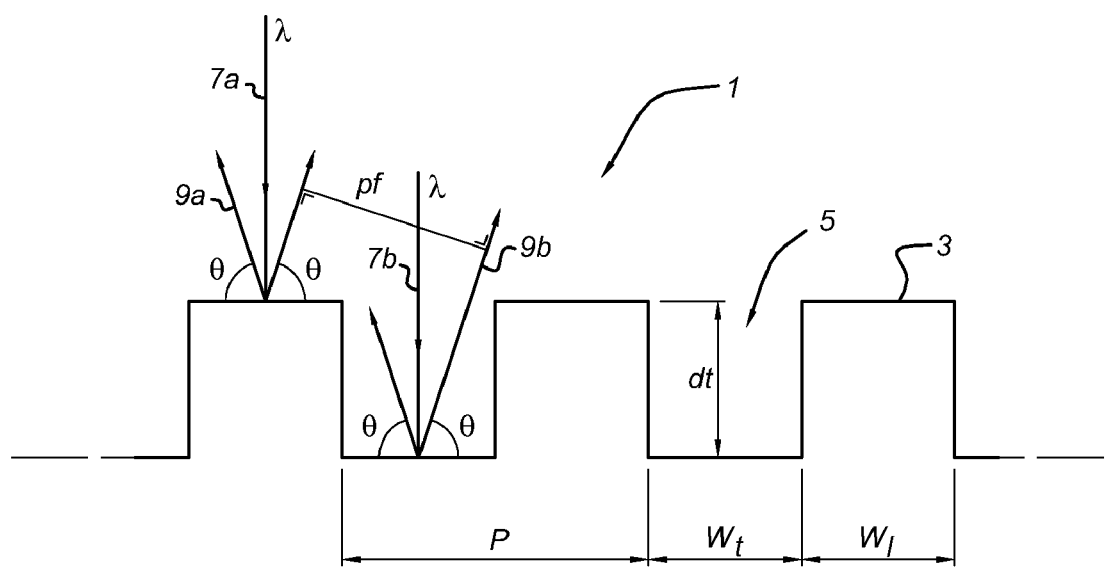
FIG. 2 schematically shows a cross-sectional view of a known marker structure to illustrate the concept of phase depth.

FIG. 2 schematically shows a cross-sectional view of a known marker structure to illustrate the concept of phase depth. An optical marker structure typically comprises a periodic pattern, i.e., a grating 1 with a periodicity P suitable for diffraction of impinging radiation with a wavelength λ. The grating consists of a series of lines 3, with interposed trenches 5. The trenches 5 have a depth dt with respect to the top surface of the lines 3. The periodicity P of the grating 1 is composed of a line width $W_L$ and a trench width $W_T$, i.e., $P=W_L+W_T$.

In FIG. 2, beams of radiation 7a, 7b with wavelength λ are directed towards the grating 1 in a direction substantially perpendicular to the surface of a substrate on which the grating 1 is provided. Alternatively, a non-perpendicular inclination of the impinging beam of radiation may be used. The grating 1 shown is a so-called phase grating. The beams of radiation 7a, 7b are diffracted on the phase grating, which results in diffracted beamlets of radiation 9a, 9b, each diffracted beamlet 9a, 9b having a diffraction angle θ relative to the surface of the substrate, as is schematically shown for two impinging beams of radiation 7a, 7b in FIG. 2.

When the diffracted beamlets 9a, 9b are projected on a sensitive screen, e.g., in a sensor device, a so-called diffraction pattern develops, i.e., a pattern comprising radiation intensity maxima and minima in an alternating pattern. In the diffraction pattern the position of intensity maxima and minima is governed by the periodicity of the grating 1.

In order to obtain sufficient diffracted radiation from the grating 1 and to obtain a diffraction pattern with well-defined diffraction maxima and minima, i.e., enough to raise the pattern above the background radiation, the grating 1 should encompass a minimal number of lines 3 and interposed trenches 5 being illuminated by the impinging beams of radiation 7a, 7b.

The intensity of the diffracted beamlets 9a, 9b is further determined by the depth dt of the trenches 5 relative to the top surface of the lines 3. In a certain direction of diffracted radiation, the radiation beams 7 diffracted at the top surface of the lines 3 and the radiation beams 7a, 7b diffracted at the bottom of the trenches 5 need a certain phase relation to obtain a positive interference between these beams of radiation in that direction, independent from the periodicity P. The depth dt of the trenches 5 relative to the top surface of the lines 3 may be such that positive interference will occur. However, another depth dt may cause aforementioned interference to be negative. In the latter case, an attenuation of the intensity of the radiation beamlets 9a, 9b will occur. The dependence between intensity of a scattered radiation beam and a depth dt of the trench 5 relative to the top surface of the line 3 is referred to as the phase depth condition.

Now referring to FIG. 2, the interference in the diffraction pattern caused by the phase grating can be deduced as follows. A first set of photons forming a first beam of radiation, in FIG. 2 the left beam of radiation 7a, reflects on the top surface of a line 3. At the same time, a second set of photons forming a second beam of radiation, in FIG. 2 radiation beam 7b, reflects at the bottom of a trench 5. In order to determine whether in a given direction, indicated by diffraction angle θ, an intensity maximum or minimum will occur, the phase difference of photons originating from the top surface of the line 3 and from the bottom of the trench 5 is compared at the propagation front PF. When the phase difference is substantially zero, an intensity maximum is present. When the phase difference is half a wavelength, a minimum intensity occurs.

A marker structure that is used to align a semiconductor substrate in processing steps of that substrate to form integrated circuits or the like is generally exposed to various deformations. As a result of such deformations the phase depth condition may change during manufacturing.

Figure 3:
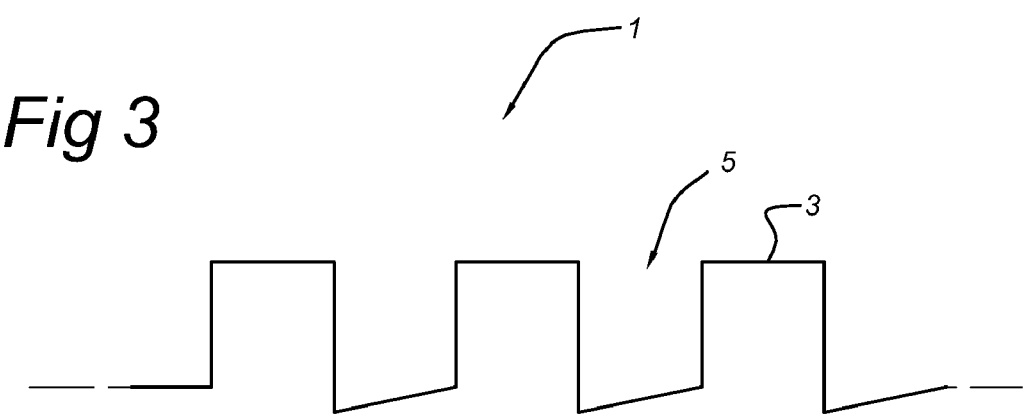
FIG. 3 schematically shows a cross-section an example of a marker structure with a periodic pattern comprising a series of lines interposed with trenches.

FIG. 3 shows an example of a marker structure with a periodic pattern 1 comprising a series of lines 3 interposed with trenches 5. The orientation of the bottom of the trenches 5 is not parallel to the orientation of the top surface of the lines 3. In other words, the phase depth dt of the marker structure 1 is ill-defined. Consequently, an aerial image composed out of +1 and −1 diffraction orders of radiation, diffracted at the marker structure upon impingement with radiation beams, is shifted with respect to its position for a well-defined marker structure. As a result, alignment measurements performed on such a marker structure will provide an alignment position error, which may lead to an increased overlay. When such alignment error is too high, the marker structure 1 may be qualified as unusable. In a worst case scenario, the substrate in its entirety is rejected during IC processing, as the yield becomes negligible. It is therefore desired to minimize the chance of yield decrease due to alignment position deviation caused by phase depth variation.

Figure 4A:
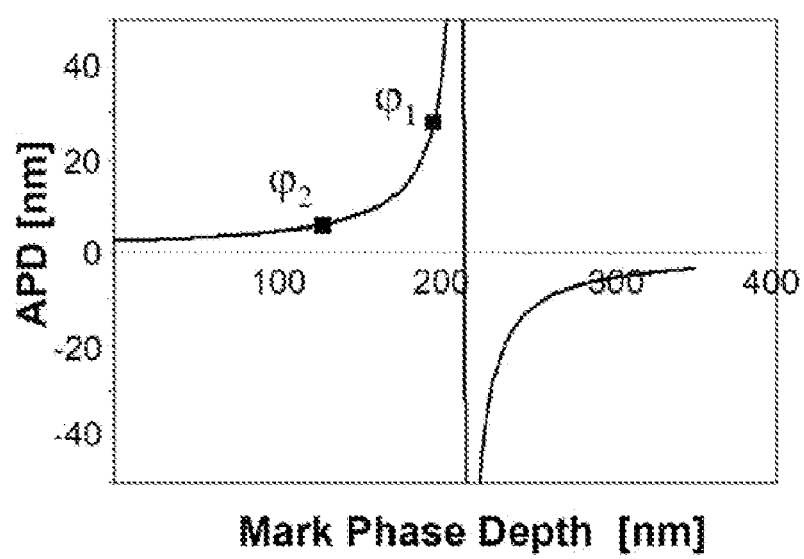
FIG. 4a shows a typical graph of Aligned Position Deviation (APD) in nm as a function of marker phase depth.

FIG. 4a shows a typical graph of aligned position deviation (APD) in nm as a function of marker phase depth, i.e., the typical phase depth of the marker structure, in nm for a certain type of periodic structure. It should be understood that different types of dependencies are possible. The graph shown in FIG. 4a, and in FIGS. 4b-4d as well only serve the purpose of illustrating issues related to aforementioned dependency.

In the graph of FIG. 4a, two phase depths are considered, denoted by $\phi_1$ and $\phi_2$ respectively. Marker structures are generally defined in BEOL (back-end of the line) layers without considering the phase depth. The layer thicknesses used in processing recipes by IC manufacturers are generally fixed by design and extremely hard to change in favor of an improved alignment marker structure performance. In the case schematically depicted in FIG. 4a, the APD in case of a marker structure with phase depth $\phi_1$ is considerably larger than the APD in case of a marker structure with phase depth $\phi_2$.

Figure 4B:
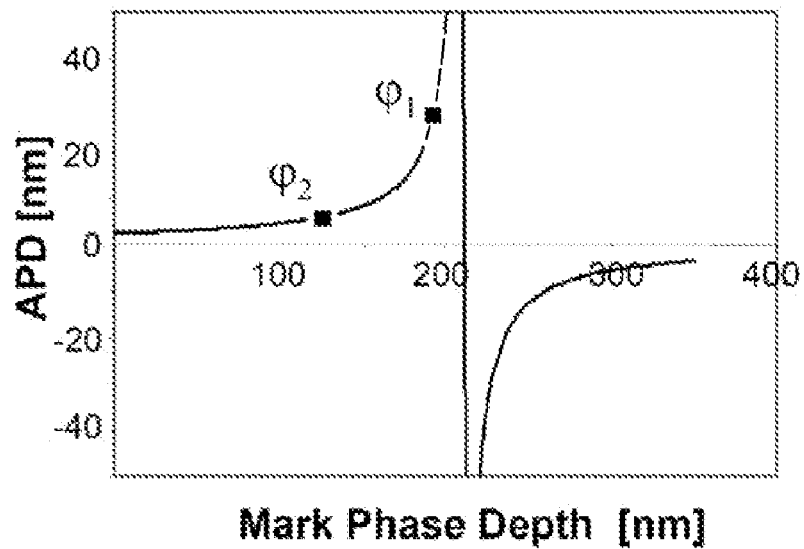
FIG. 4b schematically shows the impact of a phase depth fluctuation of about ±5 nm on APD.

Additionally, as is schematically shown in FIG. 4b, the marker structure with a phase depth $\phi_1$ clearly operates in a regime that is more sensitive to phase depth fluctuations than the marker structure with a phase depth $\phi_2$. FIG. 4b schematically shows the impact of a phase depth fluctuation of about ±5 nm on APD, i.e., the dashed lines in the graph around the phase depths $\phi_1$, $\phi_2$ as desired relate to variation of the marker structure phase depth. As can be seen, the fluctuation in APD is much larger for phase depth $\phi_1$ than it is for phase depth $\phi_2$.

Figure 4C:
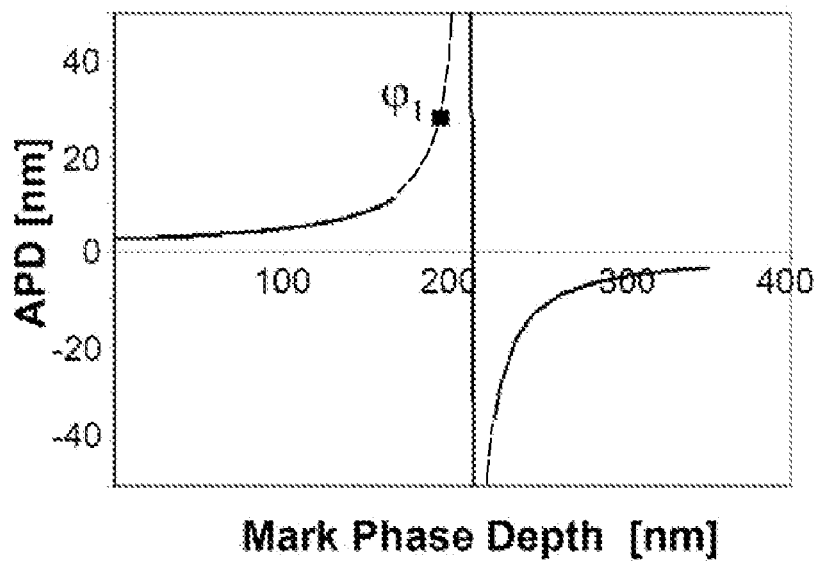
FIGS. 4c and 4d schematically show the impact of a phase depth fluctuation of about ±25 nm on APD for a marker structure with a phase depth $\phi_1$ and a marker structure with a phase depth $\phi_2$ respectively.
Figure 4D:
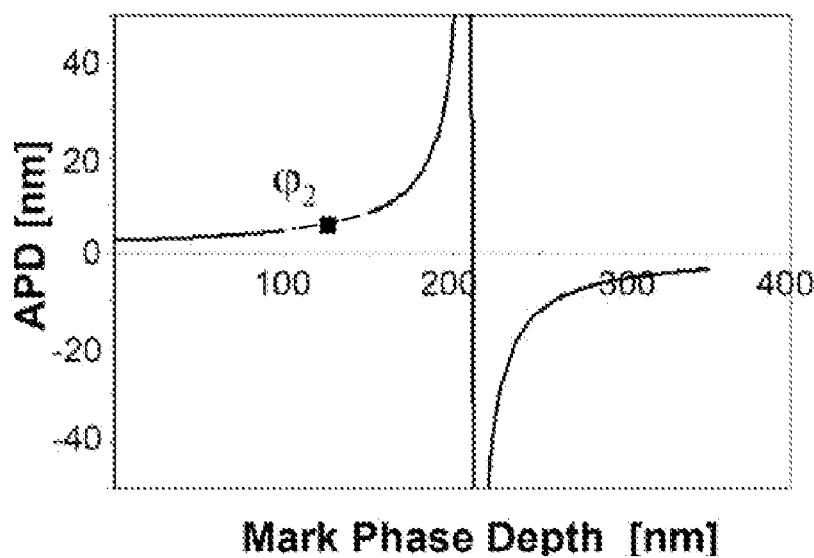

In case the phase depth fluctuations are larger, e.g., about ±25 nm, the alignment position deviation may even flip sign, as is schematically shown in FIG. 4c, which depicts the situation for a marker structure with a phase depth $\phi_1$. A similarly increased fluctuation of the phase depth only has a limited effect on the deviation of the alignment deviation in case a marker structure with a phase depth $\phi_2$ is used, as is schematically shown in FIG. 4d.

A large APD may be corrected by a process correction, however, variations in APD cannot be corrected in this way. Especially, in case the APD flips sign, as is schematically shown in FIG. 4d as a serious possibility, process corrections are impossible. Therefore, it is desirable to minimize APD variations.

Minimization may be executed by selecting a better phase depth as starting point, e.g., in FIGS. 4a to 4d phase depth $\phi_2$ serves as a better starting point than phase depth $\phi_1$. This may be done by selecting a convenient wavelength. However, application of this minimization technique is limited as often a limited number of wavelengths can be used. As a result, minimization by wavelength selection does not always provide a satisfactory result. In embodiments of the invention, a method is presented which enables further optimization of minimization of the APD variations.

In order to arrange that phase depth fluctuations have a limited effect on alignment position deviations, and thus on overlay in IC processing, embodiments of the marker structure for optical alignment of a substrate not only comprise a first reflecting surface at a first level and a second reflecting surface at a second level, in which a separation between the first level and the second level determines a phase depth condition, the marker structure further comprises an additional structure. The additional structure is arranged to modify the separation during manufacture of the marker structure.

In order to clarify the invention further, several embodiments of marker structures will be discussed in which a marker structure with an undesirable phase depth $\phi_1$ is amended to form a marker structure according to an embodiment of the invention, i.e., a marker structure with a desirable phase depth $\phi_2$, or, if applicable, $\phi_3$.

Figure 5A:
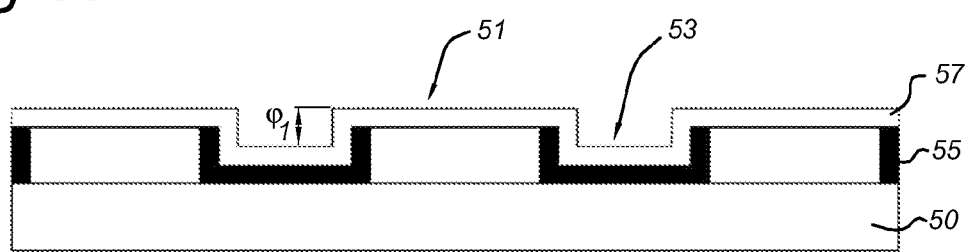
FIGS. 5a, 5b show a cross-sectional view of a first type of marker structure provided on a substrate with a phase depth $\phi_1$ and an amended phase depth $\phi_2$ respectively.
Figure 5B:
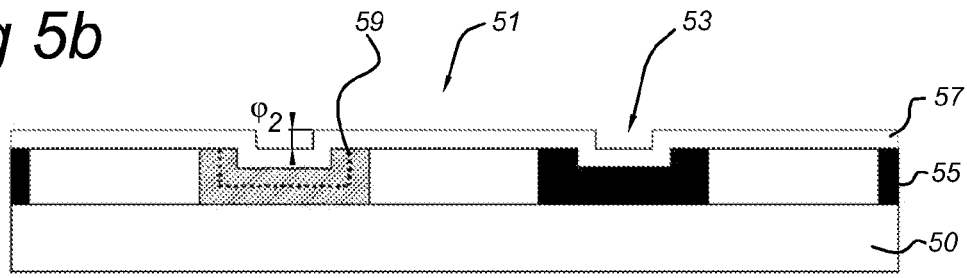

FIGS. 5a, 5b show a cross-sectional view of a first type of marker structure provided on a substrate 50 with undesirable phase depth $\phi_1$ and desirable phase depth $\phi_2$ respectively. The marker structure comprises a periodic pattern of lines 51 interposed with trenches 53. A layer of filler material 55 covers the sides and bottom of the trenches 53. Both the lines 51 and trenches 53 are covered with a reflective layer 57.

As a result, the marker structure schematically depicted in FIG. 5a comprises a first reflecting surface at a first level, i.e., the top level of the surface of the reflective layer 57 at the bottom of the trenches 53, and a second reflecting surface at a second level, the top level of the surface of the reflective layer 57 on top of the lines 51. A separation between the first level and the second level determines a phase depth condition, i.e., phase depth $\phi_1$.

In FIG. 5b, the marker structure further comprises an additional structure. In this embodiment, the additional structure is an additional layer of filler material. For clarification, the additional structure is schematically shown in the left trench. The layer outside the dotted contour corresponds with a layer thickness as used in the marker structure schematically depicted in FIG. 5a. The layer inside the dotted contour corresponds with the additional structure, and is denoted by reference numeral 59. The filler material may be Tungsten or poly-Silicon. As a result of the presence of the additional layer of filler material, the first level is raised with respect to the second level, causing a modification of the phase depth condition of the marker structure, i.e., in FIG. 5b a decrease of the phase depth towards a phase depth $\phi_2$.

A marker structure as shown in FIG. 5b, may be manufactured as follows. First a substrate 50 is provided. Subsequently, a first layer is provided on the substrate, and a first pattern is created therein. The first pattern includes aforementioned periodic structure of lines 51 and trenches 53. Then a second layer 55 is provided on top of the first pattern in the first layer. The second layer 55 is a layer of filler material. The filler material may comprise Tungsten or poly-Silicon. The second layer 55 has a predetermined thickness which corresponds to the thickness of the layer of filler material in the marker structure of FIG. 5a increased by a thickness that corresponds with the desired decrease of the phase condition. In case the original phase depth $\phi_1$ is 100 nm, while a phase depth $\phi_2$ of 700 nm is considered desirable, the desired thickness of the second layer corresponds to the thickness of the layer of filler material as present in the original marker structure increased by the difference in phase depth between $\phi_1$ and $\phi_2$, i.e., 1000−700=300 nm. Subsequently, the second layer 55 is polished, e.g., by way of chemical mechanical polishing (CMP), until the first pattern in the first layer appears. Finally, a third layer 57 is provided on top of the second layer 55, the third layer 57 being reflective for radiation of a certain wavelength. The third, reflective, layer 57 may be a metal layer, and may comprise aluminum (Al), poly-silicon (poly-Si), or a material suitable for use in a bit-line stack like tungsten (W) or Tungsten and silicon-nitride ($W+Si_3N_4$).

In this embodiment, the thickness of the second layer 55 determines the phase depth that is established. That is, the thickness of said second layer 55 may be chosen such that a certain separation between a surface of said third layer 57 on top of the series of lines 51 and a surface of the third layer 57 at the bottom of the interposed trenches 53 is established.

An increased thickness of the second layer 55 as compared to the one in the original marker structure depicted in FIG. 5a, will lead to an increased processing time due to an increase in the time needed to polish the structure. However, as the phase depth condition is improved, the overlay error decreases, and, in some cases, the yield of IC structures manufactured on the substrate improves. Of course, it should be understood that, in an embodiment, a phase depth condition improvement may also be reached by decreasing the layer thickness of the second layer 55.

Figure 6A:
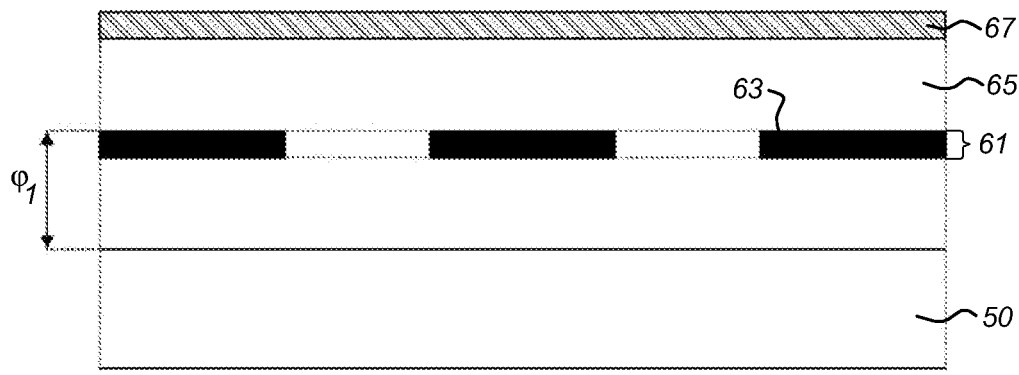
FIG. 6a shows a cross-sectional view of a second type of marker structure provided on a substrate with a phase depth $\phi_1$.
Figure 6B:
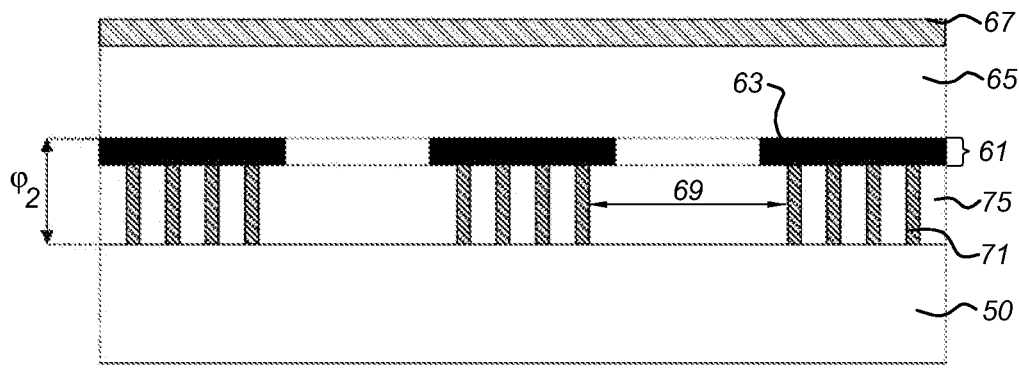
FIGS. 6b, 6c schematically show cross-sectional views of marker structures with an amended phase depth $\phi_2$ and amended phase depth $\phi_3$ respectively.
Figure 6C:
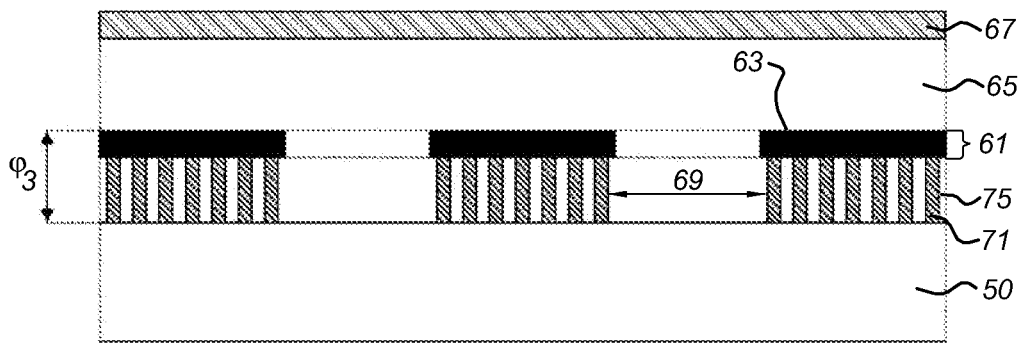

FIG. 6a shows a cross-sectional view of a second type of marker structure provided on a substrate 50 with an undesirable phase depth $\phi_1$. FIGS. 6b, 6c schematically show cross-sectional views of similar marker structures with an amended phase depth condition, i.e., phase depth $\phi_2$ and phase depth $\phi_3$ respectively. Again, the marker structure comprises a first reflecting surface at a first level and a second reflecting surface at a second level. However, in this embodiment, the first and second reflecting surfaces are located in different layers. The first reflecting surface is the top surface of the substrate 50. The second reflecting surface corresponds to the top surface of a patterned layer 61 comprising reflective elements 63. A separation between the first level and second level, now embedded in a dielectric medium like silicon oxide which is substantially transparent for radiation used to measure the marker structure, again determines the phase depth condition, i.e., phase depth $\phi_1$. The marker structure may further comprise a number of additional layers 65, 67 on top of the second reflecting surface as will be explained below.

In order to obtain a different phase depth condition, i.e., phase depth $\phi_2$ in FIG. 6b or phase depth $\phi_3$ in FIG. 6c, the marker structure further comprises an additional structure 69. The additional structure 69 is positioned between the first reflecting surface and the second reflecting surface. The additional structure 69 is shielded by the second reflecting surface from radiation impinging on the marker structure from above. The additional structure 69 comprises at least one filled cavity 71, i.e., a well-defined structure, e.g., shaped like a trench or like a contact hole or a via if it would be part of a integrated circuit structure. In FIG. 6b, each additional structure 69 comprises a plurality of filled cavities 71. The size and/or number of cavities 71 has an influence on the phase depth condition as is schematically shown in FIGS. 6b and 6c. The number of filled cavities 71 in the embodiment depicted in FIG. 6c is larger than the number of filled cavities in the embodiment in FIG. 6b. As a result the phase depth $\phi_2$ is larger than the phase depth $\phi_3$. The difference in phase depth relates to the size and/or number of filled cavities, due to an alteration of material properties of the material in the layer between substrate 50 and patterned layer 61 with respect to CMP, which will be discussed in more detail later.

The cavity 71 may be filled with a filler material like Tungsten or poly-Silicon.

A marker structure as shown in FIGS. 6b, 6c may be manufactured as follows. First a substrate 50 is provided. The top surface of the substrate 50 serves as a first reflecting surface. Subsequently, a first layer 75 is provided on the substrate 50, the first layer 75 being a transparent, electrically insulating layer. In the first layer 75, an additional structure 69, i.e., one or more filled cavities 71, is created. This can be done in a way similar to the creation of contact holes and/or vias as known by a person skilled in the art. On top of the first layer 75 with an additional structure provided therein a second layer is provided. The second layer comprises a filler material. Material of the second layer fills the cavities 71 created in the first layer 75. The "filler material" may comprise Tungsten or poly-Silicon. As a result of the presence of the filled cavities 71, the polishing resistance of the first layer weakens. In order to obtain a substantially plain surface to be able to continue to build a chip structure, the second layer is polished until the additional structure 69 in the first layer 75 appears. In an embodiment, CMP is used as polishing technique. In such a case, the polishing resistance is not necessarily lowered as a result of a different hardness of the material, i.e., mechanical resistance, but it is lowered by an increase of sensitivity for the chemical components used during CMP to lower the polishing resistance of the layer to be polished.

Due to the presence of the cavities 71 filled with filler material, which cause a lower polishing resistance, the thickness of the first layer 75 decreases as compared to the situation in which the first layer is not patterned at the location of the marker structure, i.e., the situation schematically shown in FIG. 6a. A result of aforementioned decrease of thickness is that the phase condition of the marker structure that is manufactured is different, i.e., the phase depth decreases as well, $\phi_1$ in FIG. 6a becomes $\phi_2$ in FIG. 6b. On top of the substantially plain surface that is established, a third layer 61 is provided. In the third layer 61, a first pattern is provided in a way known to a person skilled in the art, e.g., by subsequent steps of lithographic patterning, development, etching, metallization and polishing.

The first pattern includes a periodic structure comprising elements 63 being reflective for radiation of a certain wavelength. The reflective elements 63 serve as second reflecting surface of the marker structure. The reflective elements may comprise Aluminum (Al) or Copper (Cu), the latter may be used in case a single Cu-damascene process flow is used to manufacture an integrated structure on a substrate 50.

In the embodiments depicted in FIGS. 6b and 6c, aforementioned elements 63 cover the one or more filled cavities 71. As a result, the cavities are shielded from impinging radiation. On top of the plain surface a number of additional layers may be provided, the number and thickness thereof depending on the processing recipe at hand. In embodiments which are not shown, the cavities 71 may not be covered by the elements 63. Coverage does however have the advantage that the influence of cavities 71 on the performance of the marker structure is minimized.

In an application, the plain surface formed by aforementioned polishing is covered with an additional layer 65 on top of which a functional layer 67 is provided. In applications related to connections of storage node modules to bit lines, such functional layer could be a hard mask layer, e.g., an amorphous carbon mask layer. In such an application, the additional layer 65 is a storage node dielectric while the third layer 61 is a bitline layer in which the bit lines serve as reflective elements 63 in the third layer 61. In such an embodiment, one or more filled cavities 71 may serve as a bit line contact and/or a so-called landing plug contact.

In another application, instead of being covered with a hard mask layer, the additional contact layer 65 is covered with a different functional layer 67, i.e., a color filter. A marker structure provided with such a color filter may be used in Charge-Coupled Device (CCD) applications and CMOS image sensor application. In an embodiment, the color filter is substantially transparent for radiation with a wavelength between 620 nm and 780 nm, i.e., "red" light. At the same time, the color filter is substantially opaque for radiation with different wavelengths, e.g., radiation with a wavelength between 490 nm and 570 nm, i.e., "green" light. Red light is widely used in alignment applications.

It should be understood that embodiments of the invention may be very useful when applied to structures provided with a color filter. After all, the color filter limits alignment to wavelengths within the range for which the color filter is substantially transparent. In case the phase depth is non-optimal for such a wavelength, switching to a different wavelength, i.e., a wavelength for which the color filter is substantially opaque, does not improve the alignment. In such a case, embodiments of the invention may be applied to modify the phase depth as a shift to a different wavelength.

Note that it is not essential in embodiments of the invention that layer 61 is directly on top of layer 75. After aforementioned polishing of layer 75, one or more, substantially transparent, layers may be positioned on top of it before layer 61 is provided.

Figure 7A:
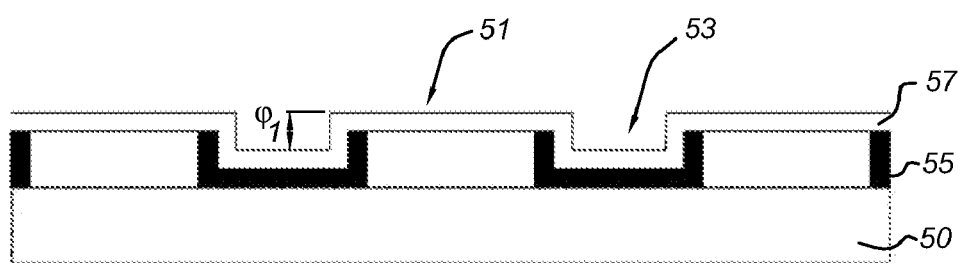
FIGS. 7a, 7b show a cross-sectional view of a third type of marker structure provided on a substrate with a phase depth $\phi_1$ and an amended phase depth $\phi_2$ respectively.
Figure 7B:
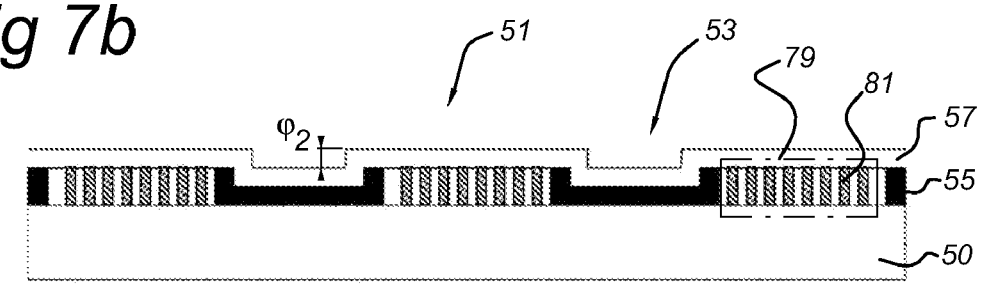

FIGS. 7a, 7b show a cross-sectional view of a third type of marker structure provided on a substrate with a phase depth $\phi_1$ and an amended phase depth $\phi_2$ respectively. The embodiment of a marker structure provided on a substrate 50 which is shown in FIG. 7a is similar to the marker structure schematically depicted in FIG. 5a. That is, the marker structure comprises a periodic pattern of lines 51 interposed with trenches 53. A layer of filler material 55 covers the sides and bottom of the trenches 53. Both the lines 51 and trenches 53 are covered with a reflective layer 57. So again, the marker structure comprises a first reflecting surface at a first level, a second reflecting surface at a second level. A separation between the first level and the second level determines a phase depth condition, i.e., phase depth $\phi_1$.

In order to obtain a different phase depth condition, i.e., a phase depth $\phi_2$ as shown in FIG. 7b instead of a phase depth $\phi_1$ as shown in FIG. 7a, the marker structure of FIG. 7a is amended in a similar way as schematically depicted in FIGS. 6b, 6c. That is, as an additional structure 79, one or more filled cavities 81 are used. The one or more filled cavities 81, as before in an embodiment similarly shaped as contact holes, vias, trenches or another type of two-dimensional segmentation, are located within the lines in the periodic pattern. As explained with respect to FIGS. 6b, 6c, due to the presence of the one or more filled cavities 81, the phase depth condition is amended under the influence of a polishing step in the manufacturing process thereof.

The cavities may again be filled with a filler material like Tungsten or poly-Silicon.

Figure 8A:
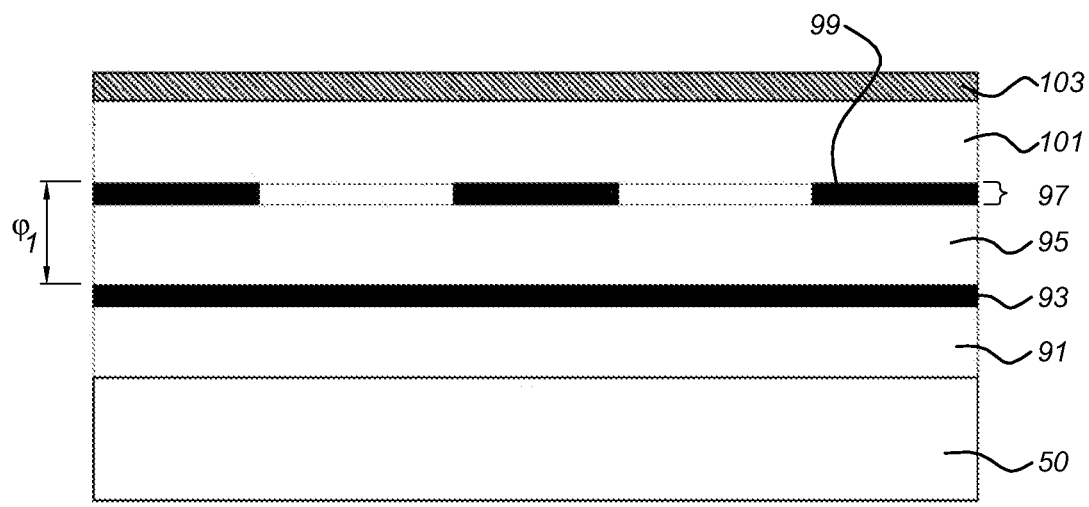
FIGS. 8a, 8b show a cross-sectional view of a fourth type of marker structure provided on a substrate with a phase depth $\phi_1$ and an amended phase depth $\phi_2$ respectively.
Figure 8B:
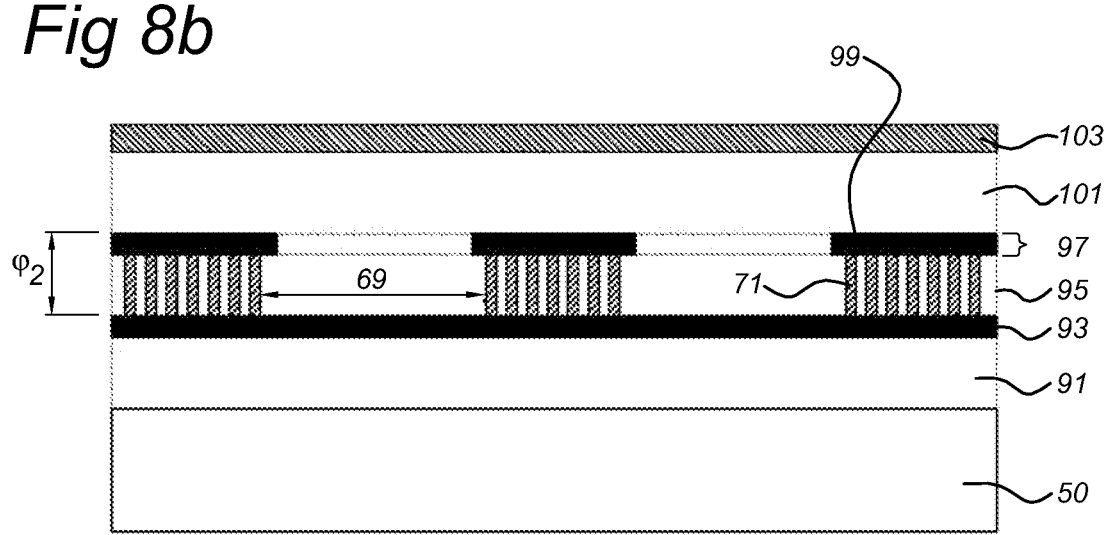

FIGS. 8a, 8b show a cross-sectional view of a fourth type of marker structure provided on a substrate 50 with a phase depth $\phi_1$ and an amended phase depth $\phi_2$ respectively. In this type of marker structure, the first reflecting surface of the marker structure does not correspond to the top surface of the substrate 50.

A cross-sectional view of an embodiment of an amended marker structure in accordance with aforementioned technique is schematically shown in FIG. 8b. In this embodiment, the additional structure 69 is again a plurality of filled cavities 71. The cavities 71 are filled with a filler material, like tungsten or poly-silicon. The cavities 71 have a shape similar to contact holes, vias, trenches or another type of two-dimensional segmentation. The additional structure 69 is present layer 95, further referred to as first via layer. On top of the first via layer 95, a second metal layer 97 is provided. The second metal layer 97 is provided with a first pattern, which is manufactured in a way similar to the first pattern present in layer 61 in the marker structures schematically shown in FIGS. 6a-6c. The pattern comprises a number of reflecting elements 99 serving as a second reflecting surface.

On top of the second metal layer 97, additional layers may be provided. The number and kind of layers depend on the application and/or the process recipe at hand. Marker structures as schematically shown in FIG. 8b may be used in CCD- and CMOS image sensor applications. In these applications, on top of the second metal layer an additional contact layer 101 is provided on top of which, in its turn, a functional layer 103, i.e., a color filter, is provided. As an example, when used in conjunction with currently common processes, the filled cavities 71 of the additional structure 69 may be filled with tungsten as filler material. Additionally, the reflective elements 99 in second metal layer 97 may include aluminum.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A marker structure for optical alignment of a substrate and provided thereon, said marker structure comprising:
   a first reflecting surface at a first level;
   a second reflecting surface at a second level, a physical separation between the first level and the second level determining a phase depth condition; and
   an additional structure, constructed and arranged to alter material properties of the marker structure with respect to a CMP process such that the physical separation is altered during manufacture of said marker structure,
   wherein the additional structure is positioned at a level between the first reflecting surface and the second reflecting surface and, on top of the second reflecting surface an additional layer is provided, on top of which a functional layer is provided and wherein the additional layer is a storage node dielectric, and the functional layer is a hard mask layer.

2. A marker structure according to claim 1, wherein said additional structure comprises a layer of filler material positioned at one side of both the first reflecting surface and the second reflecting surface.

3. A marker structure according to claim 2, wherein the filler material comprises tungsten.

4. A marker structure according to claim 1, wherein the additional structure is positioned such that it is covered by the second reflecting surface.

5. A marker structure according to claim 1, wherein the additional structure comprises a plurality of spaced cavities filled with filler material.

6. A marker structure according to claim 1, wherein the additional structure comprises at least one of tungsten and poly-silicon.

7. A marker structure according to claim 1, wherein the first reflecting surface corresponds to a surface of the substrate on which the marker structure is provided.

8. A marker structure according to claim 1, wherein the hard mask layer is an amorphous carbon mask layer.

9. A marker structure according to claim 1, wherein the additional layer is an additional contact layer, and the functional layer is a color filter.

10. A marker structure according to claim 9, wherein the color filter is substantially transparent for radiation with a wavelength between 620 nm and 780 nm.

11. A lithographic projection apparatus comprising:
    an illumination system configured to provide a beam of radiation;
    a support structure configured to support a patterning device that serves to impart said beam of radiation with a pattern in its cross-section;
    a substrate table configured to hold a substrate;
    a projection system configured to expose the patterned beam on the substrate;
    a substrate alignment system configured to detect a position of the substrate relative to a position of the patterning device, the substrate comprising at least one marker structure comprising:
    a first reflecting surface at a first level;
    a second reflecting surface at a second level, a separation between the first level and a second level determining a phase depth condition; and an additional structure, constructed and arranged to alter material properties of the marker structure with respect to a CMP process such that the separation is altered during manufacture of said marker structure wherein the additional structure is positioned at a level between the first reflecting surface and the second reflecting surface and, on top of the second reflecting surface an additional layer is provided, on top of which a functional layer is provided and wherein the additional layer is a storage node dielectric, and the functional layer is a hard mask layer.

12. A marker structure for optical alignment of a substrate and provided thereon, said marker structure comprising:

a first reflecting surface at a first level, the first reflecting surface comprising a periodic structure;

a second reflecting surface at a second level, the second level being on a substrate side of the first level, a physical separation between the first level and the second level determining a phase depth condition; and an additional structure, positioned between the first reflecting surface and the second reflecting surface and constructed and arranged to alter material properties of the marker structure with respect to a CMP process such that the physical separation is altered during manufacture of said marker structure, wherein the additional structure is covered by the first reflecting structure and wherein the additional structure comprises a periodic array of filled cavities, a period of the periodic array of filled cavities selected to provide a selected physical separation for the physical separation between the first level and the second level wherein the additional structure is positioned at a level between the first reflecting surface and the second reflecting surface and, on top of the second reflecting surface an additional layer is provided, on top of which a functional layer is provided and wherein the additional layer is a storage node dielectric, and the functional layer is a hard mask layer.

* * * * *